(12) United States Patent
Ishizaka et al.

(10) Patent No.: US 6,791,347 B2
(45) Date of Patent: Sep. 14, 2004

(54) PROBE APPARATUS APPLICABLE TO A WAFER LEVEL BURN-IN SCREENING

(75) Inventors: Masaaki Ishizaka, Yokohama (JP); Yumio Nakamura, Nagano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 38 days.

(21) Appl. No.: 10/145,023

(22) Filed: May 15, 2002

(65) Prior Publication Data

US 2002/0190740 A1 Dec. 19, 2002

(30) Foreign Application Priority Data

Jun. 19, 2001 (JP) .......................................... 2001-185358

(51) Int. Cl.[7] .............................................. G01R 31/02
(52) U.S. Cl. ........................................ 324/761; 324/754
(58) Field of Search ................................ 324/754, 755, 324/761, 762, 765; 269/21

(56) References Cited

U.S. PATENT DOCUMENTS 3,711,081 A * 1/1973 Cachon ........................ 269/21
6,483,336 B1 * 11/2002 Harris et al. ................ 324/765
6,590,381 B1 * 7/2003 Iino et al. ................. 324/158.1

FOREIGN PATENT DOCUMENTS

| JP | 2922486 | 4/1999 |
| JP | 2925964 | 5/1999 |

* cited by examiner

Primary Examiner—Vinh P. Nguyen
(74) Attorney, Agent, or Firm—McDermott Will & Emery

(57) ABSTRACT

A probe card is used for a burn-in screening or inspection applied to a semiconductor wafer. The probe includes a pressure substrate. An elastic member is disposed on the pressure substrate. A wiring substrate is disposed on the elastic member. A spacer is disposed on the pressure substrate and spaced radially outward from a periphery of the wiring substrate. A plurality of bumps are formed on a membrane disposed on the wiring substrate, with electric connection between the bumps and a wiring of the wiring substrate. A ceramic ring is disposed on the spacer for tightly holding a periphery of the membrane.

15 Claims, 6 Drawing Sheets

PROBE APPARATUS APPLICABLE TO A WAFER LEVEL BURN-IN SCREENING

BACKGROUND OF THE INVENTION

The present invention relates to a probe arrangement which is effective for performing a burn-in screening applied to a plurality of semiconductor devices of a wafer condition at a time. The burn-in screening is performed to enhance the reliability of semiconductor devices.

Conventionally, to enhance the reliability of semiconductor devices, the screening of semiconductor devices is performed in the following manner. Each semiconductor device is subjected to a rated or a slightly excessive voltage supplied from an electric power source. The burn-in screening takes several hours. During the burn-in screening, a pseudo signal resembling to an actual operation signal is applied to each signal input electrode, while the semiconductor device is continuously exposed to a high-temperature environment of approximately 125° C.

According to a conventional burn-in screening method, a plurality of semiconductor devices are assembled as a package and are subjected at a time to the burn-in screening.

On the other hand, a new burn-in screening method has been recently proposed. The new burn-in screening method is characterized in that the burn-in screening is applied to wafer-state semiconductor devices, such as bare chips and CSP (chip size package).

To realize the packaged burn-in screening applied to wafer-state semiconductor chips, bonding pads are used. The bonding pads serve as lead electrodes for a plurality of semiconductor chips manufactured at a time on a semiconductor wafer. A signal line is connected to the bonding pad. A signal is thus applied to the bonding pad via the signal line. Usually, the number of semiconductor chips formed together on a wafer surface is in a range from 200 to 1,000. Each semiconductor chip is provided with 20 to 40 bonding pads each being an electrode of 100 $\mu$m or a comparable micro size. Thus, the total number of signal lines connected to a single wafer raises up to a higher level of 4,000 to 40,000. Thus, accurate connection of such numerous signal lines to corresponding bonding pads is a key to succeed in the packaged burn-in screening. Regarding a technique relating to a packaged or batch contact of numerous signal lines to a semiconductor wafer, a TPS probe is disclosed in the scientific magazine "NIKKEI MICRO DEVICE", 1997, July, from page 126.

FIG. 7 shows a conventional TPS probe card 120 which includes a platelike wiring substrate 71, together with a ceramic ring 72, a PCR (i.e., pressure-sensitive conductive rubber) 73, and a bump-formed membrane 74 provided on an upper surface of wiring substrate 71. The wiring substrate 71 is made of a glass or a comparable material having a thermal expansion coefficient similar to that of a semiconductor wafer. The wiring substrate 71 has a surface brought into contact with the PCR 73. A signal, transmitted from the PCR 73 to the surface of wiring substrate 71, is output to the outside via a wiring arranged on this surface of wiring substrate 71. The PCR 73 is soft and thus has a function of absorbing the altitudinal dispersion of the bonding pads of a semiconductor chip and the bumps of TPS probe card 120. Thus, PCR 73 ensures the transmission of signal from the bumps.

An outer diameter of ceramic ring 72 is smaller than the radial (or longitudinal) size of wiring substrate 71. PCR 73 is located beneath the bump-formed membrane 74 and is positioned within an inner rim of ceramic ring 72. A periphery of bump-formed membrane 74 is tightly held by the ceramic ring 72. The bump-formed membrane 74 includes numerous bumps (104 shown in FIG. 10A) formed on a membrane. Each bump provides electric connection to a corresponding bonding pad of a semiconductor wafer. PCR 73 is placed on an upper surface of wiring substrate 71 and is sandwiched from above by the bump-formed membrane 74.

Published Japanese patent No. 2922486 discloses a practical structure for a TPS probe card consisting of the bump-formed membrane, PCR, and the wiring substrate.

More specifically, as shown in FIGS. 10A and 10B, a circular groove 107 is formed on the wiring substrate 71. The ceramic ring 72 has a circular protrusion 108 formed on the lower surface thereof. The ring groove 107 engages or mates with the circular protrusion 108 when the ceramic ring 72 is assembled on the wiring substrate 71. Thus, the circular groove 107 and the circular protrusion 108 cooperatively fix the position of ceramic ring 72 with respect to the wiring substrate 71.

The wiring substrate 71 has external electrodes 109 formed along an end side thereof. An electric lead extends in the body of wiring substrate 71 to provide electric connection between each external electrode 109 and a corresponding inner electrode.

Numerous bumps 104 are formed on the surface of bump-formed membrane 74. The bumps 104 are located inside the inner rim of ceramic ring 72.

The wiring substrate 71 has screw holes 71a. The bump-formed membrane 74 has screw holes 74a. The ceramic ring 72 has screw holes 72a. The screw holes 71a, 74a, and 72a coincide with each other. The screw holes 71a, 74a, and 72a are the same number and have the same positional relationship.

The PCR 73 and the bump-formed membrane 74 are successively mounted on the upper surface of the wiring substrate 71 in such a manner an electrical path is formed from the bump 104 to the external electrode 109 via the PCR 73.

The ceramic ring 72 is placed on the bump-formed membrane 74 and tightly holds or fixes the periphery of bump-formed membrane 74.

Screws 106 are inserted into the screw holes 72a, 74a, and 71a across the stacked layers of ceramic ring 72, bump-formed membrane 74, and wiring substrate 71. The distal end of each screw 106 is engaged in a hole 71a formed on the wiring substrate 71, thereby firmly fixing the stacked layers of ceramic ring 72, bump-formed membrane 74, and wiring substrate 71 as TPC probe card 120.

FIG. 8 shows the arrangement of a conventional wafer tray unit (i.e., vacuum chuck) 121 combinable with the TPS probe card 120 shown in FIG. 7.

The wafer tray unit 121 shown in FIG. 8 includes a wafer tray 81, a wafer mounting base 82, a seal ring 83, and a vacuum valve 84. The wafer tray 81 is a platelike member. The wafer mounting base 82 is placed on an upper surface of wafer tray 81. The wafer mounting base 82 brings an effect of substantially raising the central portion of wafer tray 81 by an amount equal to the height of wafer mounting base 82. A semiconductor wafer to be inspected is placed on an upper surface of wafer mounting base 82. The seal ring 83 is made of a rubber material. The wafer tray 81 has a groove formed in an outer peripheral region thereof. The seal ring 83 is fitted into and firmly held in this groove of wafer tray 81. When the wafer tray unit 121 is assembled with the TPS probe card 120, the seal ring 83 provides an airtight sealing between them so as to define a vacuum chamber. The seal ring 83 holds a vacuum formed in the vacuum chamber. The vacuum valve 84 is attached to a side surface of wafer tray 81, and is connected to a vacuum pump (not shown).

The wafer tray unit 121 shown in FIG. 8 is assembled with the TPS probe card 120 shown in FIG. 7 in the following manner.

FIGS. 11A and 11B show a conventional alignment apparatus for aligning a semiconductor wafer 91 with respect to the probe card 120. FIG. 11A is a plan view of the alignment apparatus, and FIG. 11B is a side view of the alignment apparatus.

In FIG. 11A, the semiconductor wafer 91 is placed on the wafer tray unit 121. The wafer tray unit 121 has a plurality of holes opened on an upper surface thereof. The semiconductor wafer 91 is fixed on the wafer tray unit 121 by drawing a vacuum through the holes opened on the upper surface of wafer tray unit 121. A heater 121a is provided in the wafer tray unit 121 together with a temperature sensing device (not shown). The heater 121a generates heat and increases the temperature of semiconductor wafer 91. The temperature sensing device detects the temperature of semiconductor wafer 91. A heater control unit (not shown) actuates the heater 121a based on a sensing signal of the temperature sensing device to adjust the temperature of the semiconductor wafer 91 to a desired value.

A probe card alignment camera 122 is fixed to a wafer stage 123 together with the wafer tray unit 121. The probe card alignment camera 122 is directed upward for aligning the probe card 120 positioned above this camera 122. The probe card 120 is held facedown. Thus, the probe card alignment camera 122 picks up an image of bumped surface 125 of probe card 120.

A wafer alignment camera 126 is fixed to a probe card stage 127 together with the probe card 120. The wafer alignment camera 126 is directed downward for aligning the semiconductor wafer 91 and for detecting the position of bonding pads.

An image recognition apparatus (not shown) is associated with the probe card alignment camera 122. The image recognition apparatus detects the position and the height of bumped surface 125 of probe card 120 based on an image of probe card 120 picked up by the probe card alignment camera 122. When the position of probe card 120 is not parallel to the upper surface of wafer tray unit 121, an automatic adjustment is performed first of all to bring the probe card 120 and the upper surface of wafer tray unit 121 into a parallelized condition.

The semiconductor wafer 91 is carried onto the wafer tray unit 121. The alignment apparatus shown in FIGS. 11A and 11B is equipped with an X-axis control motor 129, a Y-axis control motor 128, and a θ control motor 130. The X-axis control motor 129 controls an X-axis position of the semiconductor wafer 91. The Y-axis control motor 128 controls a Y-axis position of the semiconductor wafer 91. The θ control motor 130 controls an angle θ of the semiconductor wafer 91. In other words, the X-axis control motor 129, the Y-axis control motor 128, and the θ control motor 130 cooperate as alignment means for controlling the position/direction (i.e., X, Y and θ) of semiconductor wafer 91 in a horizontal plane. Under the control of these motors 128, 129 and 130, the semiconductor wafer 91 shifts on an X-Y plane and stops at a predetermined position just below the probe card 120.

The alignment apparatus is further equipped with a Z-axis control mechanism 131. The Z-axis control mechanism 131 raises the wafer tray unit 121 in the up-and-down direction. The semiconductor wafer 91 mounted on the wafer tray unit 121 is thus raised in the up-and-down direction (i.e., in the Z-axis direction). The semiconductor wafer 91 contacts the probe card 120, while the probe card 120 is supported facedown by the probe card stage 127.

FIG. 9 shows an assembled condition of the TPS probe card 120 and the wafer tray unit 121, with the semiconductor wafer 91 interposed or sandwiched between the TPS probe card 120 and the wafer tray unit 121.

In FIG. 9, the semiconductor wafer 91 is an object to be subjected to a burn-in inspection. The semiconductor wafer 91 is placed on the wafer mounting base 82. The bump-formed membrane 74 is positioned on the semiconductor wafer 91 placed on the wafer mounting base 82. The lower surface, i.e., bumped surface 125, of bump-formed membrane 74 is brought into contact with an upper surface of semiconductor wafer 91 placed on the wafer mounting base 82.

In this assembled condition, the vacuum pump is activated to reduce the inside pressure of the vacuum chamber.

Published Japanese patent No. 2925964 discloses a practical method for vacuumizing the chamber defined by the wafer tray unit and the TPS probe card assembled togther via the seal ring.

The semiconductor wafer 91 is subjected to a measurement for checking electric characteristics under a high-temperature environment. Electric power is supplied to the heater 121a. The wafer tray unit 121 and the semiconductor wafer 91 mounted thereon are heated togther by the heater 121a. Heat of heater 121a is transmitted to the probe card 120 via the semiconductor wafer 91. Thus, the probe card 120 is also heated.

According to the above-described conventional probe apparatus, the wafer tray unit 121 has the seal ring 83 located adjacent to the periphery of semiconductor wafer 91. If the clearance between the seal ring 83 and the semiconductor wafer 91 is large, an atmospheric pressure will act on the wiring substrate 71 and the wafer tray 81 from outside because there is no intervening member supporting the wiring substrate 71 and the wafer tray 81 from inside. The wiring substrate 71 will warpage at its peripheral region. As a result, an excessive pressure is applied onto the bumps of the probe card 120 connected to the peripheral region of the semiconductor wafer 91. On the contrary, a reduced or relatively small pressure is applied onto the bumps of the probe card 120 connected to the central region of the semiconductor wafer 91. Due to insufficiency of the applied pressure, no electric connection will be provided between the central region of the semiconductor wafer 91 and the bumps of the probe card 120. As a result, the electric connection between the semiconductor wafer 91 and the probe card 120 becomes unstable.

The above-described conventional probe apparatus employs a structure for utilizing the atmospheric pressure to apply a necessary pressure to the bumps of the probe card 120 connected to the semiconductor wafer 91. To this end, the pressure of the chamber defined by the wafer tray unit 121 and the probe card 120 with the seal ring 83 is reduced by the vacuum pump. Accordingly, the available maximum pressure per unit area of the semiconductor wafer 91 is limited to 1 kgf equivalent to the atmospheric pressure.

Considering the above-described unstable factor with respect to the connection between semiconductor wafer 91 and the probe card 120 as well as the available maximum pressure, the pin number (i.e., the number of bonding pads or bumps) per unit area is limited to a predetermined level. Usually, the required load per pin is 13 gf. This means that the pin number for a 8-inch wafer having an area of 314 cm$^2$ (diameter=200 mm) is limited to 20,265 pins. In other words, an average pin number is limited to approximately 64 pins/cm$^2$.

SUMMARY OF THE INVENTION

In view of the foregoing problems, the present invention has an object to provide a probe card capable of applying a uniform pressure to a wafer surface and assuring a stable electric connection between the probe card and a semiconductor wafer.

Furthermore, the present invention has an object to provide a probe card enabling a wafer level burn-in screening applied to a semiconductor wafer having 20,000 pins (in this case, bonding pads) or more.

Furthermore, the present invention has an object to provide a related wafer tray unit assembled with the probe card of the present invention.

Moreover, the present invention has an object to provide a probe apparatus comprising the probe card and the related wafer tray unit of the present invention.

To accomplish the above and other related objects, the present invention provides a probe card used for a burn-in screening or inspection applied to a semiconductor wafer. The probe card of the present invention comprises a main body substrate, an elastic member disposed on the main body substrate, a wiring substrate disposed on the elastic member, a spacer disposed on the main body substrate and spaced radially outward from a periphery of the wiring substrate, a plurality of bumps formed on a membrane disposed on the wiring substrate with electric connection between the bumps and a wiring of the wiring substrate, and a holding ring disposed on the spacer for tightly holding a periphery of the membrane.

According to an embodiment of the present invention, it is preferable that the elastic member has higher elasticity at an outer peripheral region thereof compared with elasticity at a central region thereof. The elastic member consists of a plurality of rubber members which are coaxial with each other and are arranged successively in a radial direction. A radially outermost rubber member has highest elasticity. The plurality of rubber members have successively increasing elasticities in such a manner that a radially outermost rubber member has highest elasticity and a radially innermost rubber member has lowest elasticity. The main body substrate is made of a glass or a comparable material. The main body substrate has a radial size larger than that of the wiring substrate. The holding ring has a radial size substantially identical to or slightly smaller than that of the main body substrate. The wiring substrate is entirely involved within an area defined by an inner rim of the holding ring. A radial gap between the holding ring and the wiring substrate is in a range from 1/20 to 1/5 of a diameter of the semiconductor wafer. The spacer has a radial size substantially identical to or slightly smaller than that of the main body substrate and is larger than that of the wiring substrate.

Furthermore, according to an embodiment of the present invention, it is preferable that the elastic member is a single rubber member. The single rubber member has a radial size substantially identical with that of the wiring substrate. The single rubber member has uniform elasticity. The single rubber member has a sufficient thickness for absorbing warpage of the main body substrate. A predetermined amount of warpage is given to the main body substrate beforehand to cancel a bending of the main body substrate when subjected to an external force. A polyimide film is coated on a reverse surface of the main body substrate so as to counteract the bending of the main body substrate.

The present invention provides a wafer tray unit used for a burn-in screening or inspection applied to a semiconductor wafer. The wafer tray unit of the present invention comprises a wafer tray, a wafer mounting base provided on the wafer tray for mounting a semiconductor wafer, a seal ring disposed on the wafer tray and spaced radially outward from a periphery of the wafer mounting base, and a passage formed in the wafer tray with one end of the passage connected to a vacuum valve and the other end of the passage opened into a gap between the seal ring and the wafer mounting base. A radial gap between the seal ring and the wafer mounting base is in a range from 1/20 to 1/5 of a diameter of the semiconductor wafer.

The present invention provides a first probe apparatus used for a burn-in screening or inspection applied to a semiconductor wafer. The first probe apparatus comprises a probe card and a wafer tray unit. The probe card comprises a main body substrate, an elastic member disposed on the main body substrate, a wiring substrate disposed on the elastic member, a spacer disposed on the main body substrate and spaced radially outward from a periphery of the wiring substrate, a plurality of bumps formed on a membrane disposed on the wiring substrate with electric connection between the bumps and a wiring of the wiring substrate, and a holding ring disposed on the spacer for tightly holding a periphery of the membrane. The wafer tray unit comprises a wafer tray, a wafer mounting base provided on the wafer tray for mounting a semiconductor wafer, a seal ring disposed on the wafer tray and spaced radially outward from a periphery of the wafer mounting base, and a passage formed in the wafer tray with one end of the passage connected to a vacuum valve and the other end of the passage opened into a gap between the seal ring and the wafer mounting base.

According to the first probe apparatus, the semiconductor wafer is placed on the wafer mounting base of the wafer tray unit and is sandwiched from behind side by the probe card so as to provide electric connection between the bumps of the probe card and bonding pads of the semiconductor wafer. And, the seal ring of the wafer tray unit is brought into contact with the probe card at a portion corresponding to the spacer so as to provide an airtightly closed space between the probe card and the wafer tray unit, the airtightly closed space serving as a vacuum chamber accommodating the semiconductor wafer and communicating with the vacuum valve via the passage formed in the wafer tray.

The present invention provides a second probe apparatus used for a burn-in screening or inspection applied to a semiconductor wafer. The second probe apparatus comprises a probe card, a wafer tray unit, and a reversed tray unit. The probe card comprises a wiring substrate having at least one through hole, a plurality of bumps formed on a membrane disposed on the wiring substrate with electric connection between the bumps and a wiring of the wiring substrate, and a holding ring disposed on the wiring substrate for tightly holding a periphery of the membrane. The wafer tray unit comprises a wafer tray, a wafer mounting base provided on the wafer tray for mounting a semiconductor wafer, a seal ring disposed on the wafer tray and spaced radially outward from a periphery of the wafer mounting base, and a passage formed in the wafer tray with one end of the passage connected to a vacuum valve and the other end of the passage opened into a gap between the seal ring and the wafer mounting base. The reversed tray unit comprises a reversed tray, a reversed mounting base provided on the reversed tray, and a reversed seal ring disposed on the reverse tray.

According to the second probe apparatus, the semiconductor wafer is placed on the wafer mounting base of the wafer tray unit and is sandwiched from behind side by the probe card so as to provide electric connection between the bumps of the probe card and bonding pads of the semiconductor wafer. The seal ring of the wafer tray unit is brought into contact with the probe card so as to provide an airtightly closed space between the probe card and the wafer tray unit, the airtightly closed space serving as a first vacuum chamber accommodating the semiconductor wafer and communicating with the vacuum valve via the passage formed in the wafer tray. And, the reversed seal ring of the reversed tray unit is brought into contact with a behind side of the probe card to provide an airtightly closed space between the probe card and the reversed tray unit which serves as a second vacuum chamber, the second vacuum chamber communicating with the first vacuum chamber via the through hole of the wiring substrate.

According to an embodiment of the present invention, the reversed tray has a size substantially identical to that of the wafer tray. The reversed seal ring of the reversed tray unit has a size substantially identical to that of the seal ring of the wafer tray unit.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF PREFERRED EMBODIMENTS

Hereinafter, preferred embodiments of the present invention will be explained with reference to the attached drawings. In the following explanation, a probe apparatus is explained as combination of a probe card and a wafer tray unit which are assembled with each other.

First Embodiment

Figure 1A:
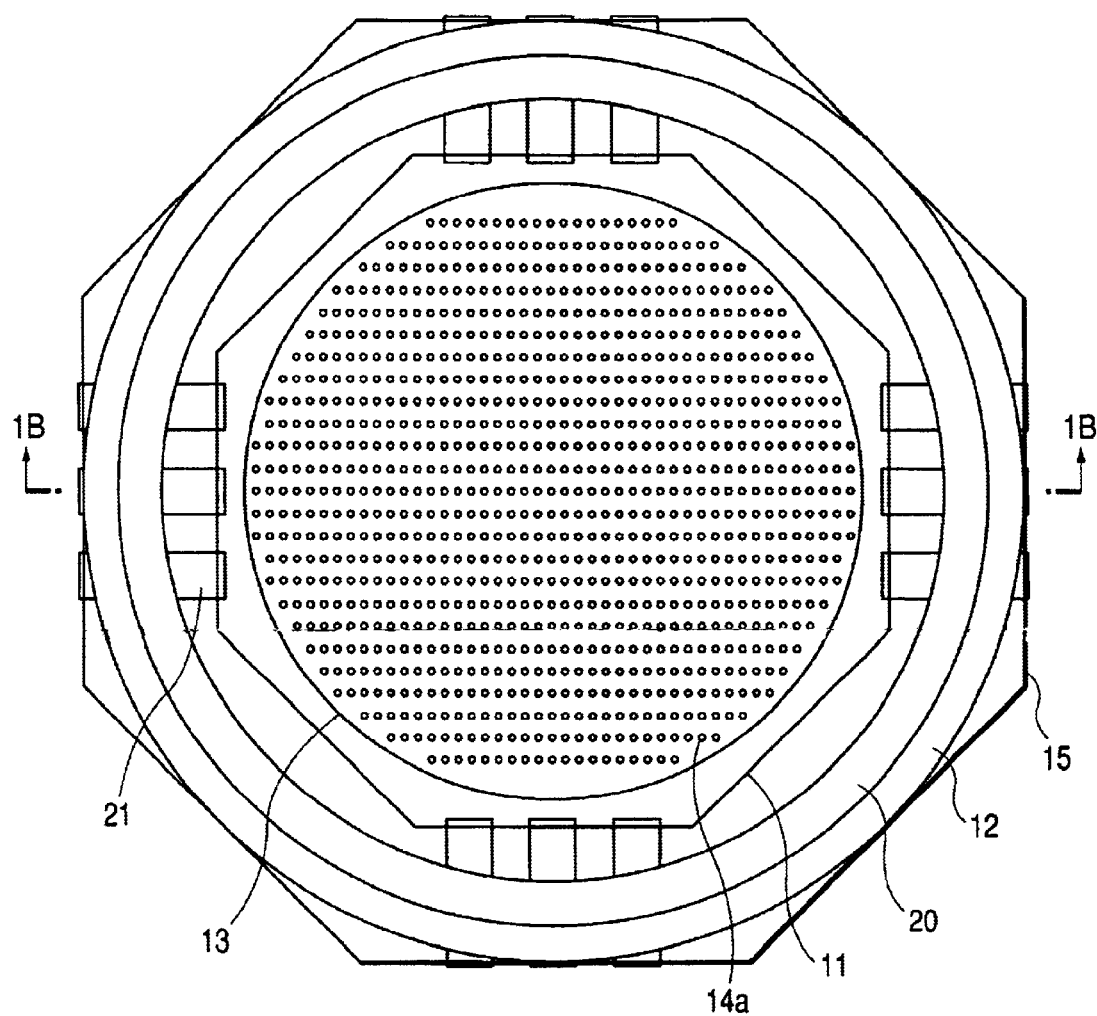
FIG. 1A is a plan view showing a probe card of a probe apparatus in accordance with a first embodiment of the present invention.
Figure 1B:
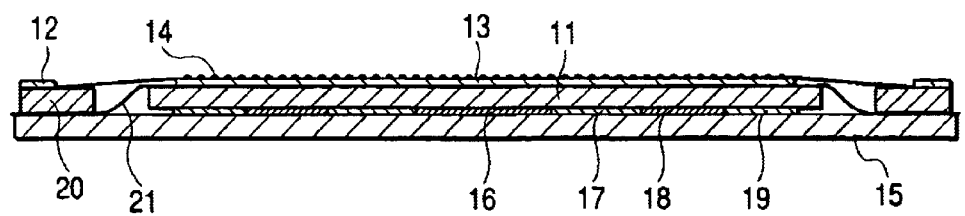
FIG. 1B is a cross-sectional view showing the probe card of the probe apparatus in accordance with the first embodiment of the present invention, taken along a line 1B—1B of FIG. 1A.

FIGS. 1A and 1B show a probe card of a probe apparatus in accordance with a first embodiment of the present invention.

The probe card shown in FIGS. 1A and 1B has a wiring substrate 11, a ceramic ring 12, a PCR (i.e., pressure-sensitive conductive rubber) 13, a bump-formed membrane 14, pressure substrate 15, a first rubber member 16, a second rubber member 17, a third rubber member 18, a fourth rubber member 19, a spacer 20, and flexible cables 21.

The wiring substrate 11 is made of a glass or a comparable material having a thermal expansion coefficient similar to that of a semiconductor wafer. The wiring substrate 11 has a surface brought into contact with the PCR 13. A predetermined wiring pattern is formed on this surface. A signal is transmitted from the PCR 13 to the surface of wiring substrate 11 and is output to the outside via the wiring formed on the surface of wiring substrate 11. The PCR 13 is soft and thus has a function of absorbing the altitudinal dispersion of the bonding pads of a semiconductor chip and the bumps of a probe card. Thus, PCR 13 ensures the transmission of signal from the bumps.

The bump-formed membrane 14 includes a membrane which is tightly held by the ceramic ring 12. Numerous bumps 14a are formed on this membrane. Each bump 14a provides electric connection to a corresponding bonding pad of a semiconductor wafer. Namely, when the bump-formed membrane 14 is located on a semiconductor wafer to be inspected, the bumps 14a are brought into contact with bonding pads of the semiconductor wafer.

The pressure substrate 15 is made of a glass or a comparable material having relatively higher rigidity. The size of pressure substrate 15 is larger than that of wiring substrate 11. The size of circular ceramic ring 12 is substantially identical to or slightly smaller than that of pressure substrate 15. An outer diameter of ceramic ring 12 is equal to that of spacer 20. The inner rim of ceramic ring 12 is radially spaced from the periphery of wiring substrate 11. In other words, the wiring substrate 11 is entirely involved within an area defined by the inner rim of ceramic ring 12. The inner diameter of ceramic ring 12 is sufficiently larger than the radial size of wiring substrate 11. Preferably, according to the illustration shown in FIGS. 1A and 1B, the radial gap between the ceramic ring 12 and the wiring substrate 11 is in a range from $\frac{1}{20}$ to $\frac{1}{5}$ of the diameter of a semiconductor wafer.

PCR 13 is located beneath the bump-formed membrane 14. In other words, PCR 13 is placed on an upper surface of wiring substrate 11 and is sandwiched from above by the bump-formed membrane 14. A periphery of bump-formed membrane 14 is tightly held by the ceramic ring 12. The size of PCR is substantially equal to or slightly smaller than that of wiring substrate 11. The bumps 14a of bump-formed membrane 14 are positioned within the periphery (i.e., the projected area) of PCR 13.

FIG. 1A shows the bumps 14a of the bump-formed membrane 14, although the membrane is illustrated as transparent for the purpose of showing the layout (i.e., the plan view) of octagonal wiring substrate 11, annular ceramic ring 12, circular PCR 13, annular spacer 20, a total of twelve flexible cables 21, and octagonal pressure substrate 15. The area of bumps 14a is substantially identical with the area of a semiconductor wafer.

The first to fourth rubber members 16–19, interposed or sandwiched between the wiring substrate 11 and the pressure substrate 15, are circular and mutually coaxial, and successively disposed in a radial direction. The first rubber member 16 is located at the center. The second rubber member 17 has a larger diameter than the first rubber member 16 and located just outside of the first rubber member 16. The third rubber member 18 has a larger diameter than the second rubber member 17 and located just outside of the second rubber member 17. The fourth rubber member 19 has a larger diameter than the third rubber member 18 and located just outside of the third rubber member 18. In short, the elastic member is interposed or sandwiched between the wiring substrate 11 and the pressure substrate 15. The elastic member consists of a plurality of rubber members which are coaxial with each other and are arranged successively in the radial direction.

The second rubber member 17 has higher elasticity than the first rubber member 16. The third rubber member 18 has higher elasticity than the second rubber member 17. The fourth rubber member 19 has higher elasticity than the third rubber member 18. Due to the difference in elasticity, a relatively large deformation is required for the fourth rubber member 19 to transmit a predetermined pressure while a relatively small deformation is required for the first rubber member 16 to transmit the same pressure.

The spacer 20 is circular and disposed on the pressure substrate 15. The spacer 20 is offset (i.e., spaced) radially outward from the wiring substrate 11. The spacer 20 is directly disposed on the pressure substrate 15. The wiring substrate 11 is disposed on the pressure substrate 15 via first to fourth rubber members 16 to 19. A gap is provided between the wiring substrate 11 and the spacer 20. An outer diameter of spacer 20 is substantially identical to or slightly smaller than that of pressure substrate 15. The spacer 20 has a function of holding a vacuum condition.

The flexible cables 21 are connected to signal lines (or electrodes) of the wiring substrate 11 to transmit the signals of wiring substrate 11 to the outside of pressure substrate 15.

Figure 2A:
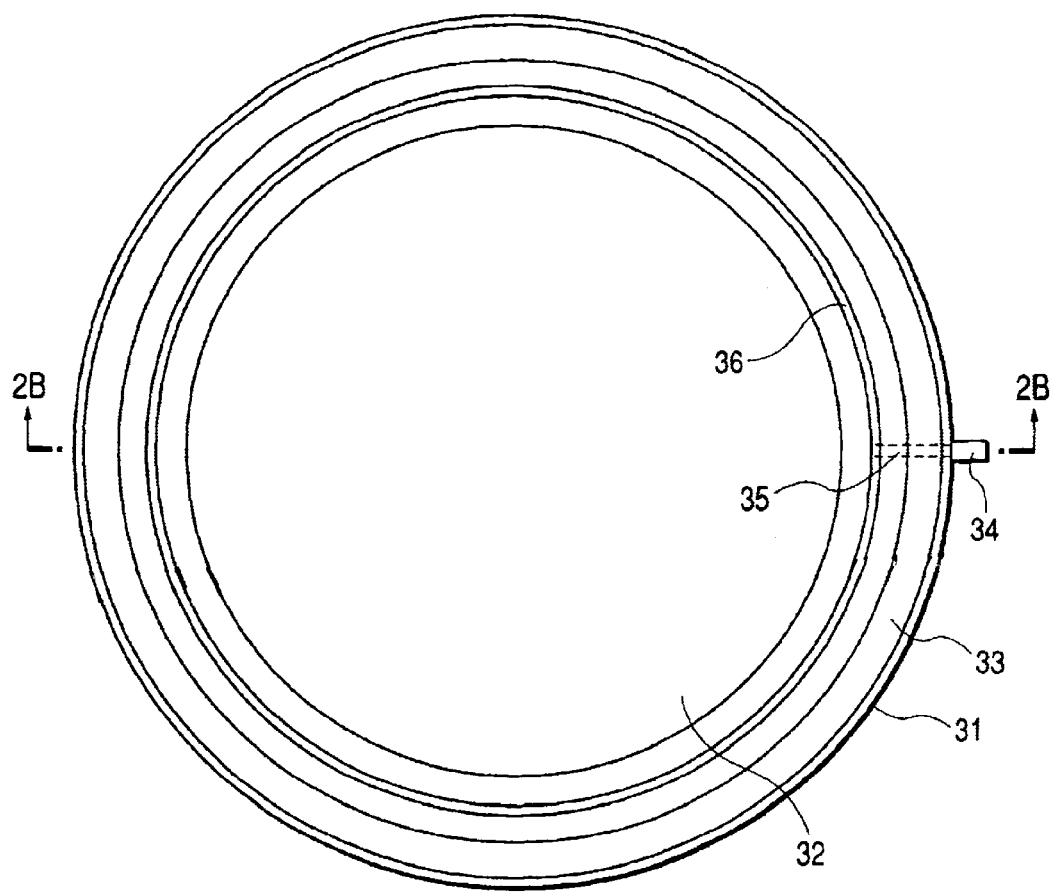
FIG. 2A is a plan view showing a wafer tray unit of the probe apparatus in accordance with the first embodiment of the present invention.
Figure 2B:
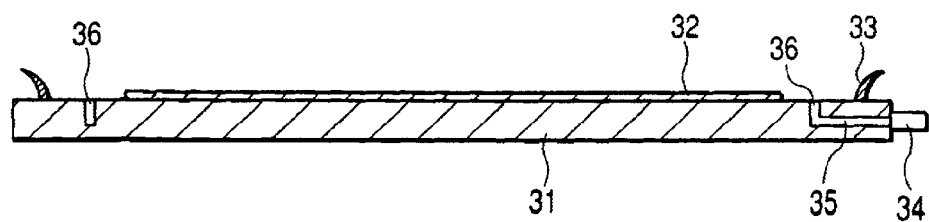
FIG. 2B is a cross-sectional view showing the wafer tray unit of the probe apparatus in accordance with the first embodiment of the present invention, taken along a line 2B—2B of FIG. 2A.

FIGS. 2A and 2B show a wafer tray unit of the probe apparatus in accordance with the first embodiment of the present invention which is combinable with the probe card shown in FIGS. 1A and 1B.

The wafer tray unit shown in FIGS. 2A and 2B includes a wafer tray 31, a wafer mounting base 32, a seal ring 33, and a vacuum valve 34. The wafer tray 31 is a circular plate member which has sufficient thickness or rigidity so as not to deform against the atmospheric pressure. The wafer mounting base 32, being a circular member coaxial with the wafer tray 31, is placed on an upper surface of wafer tray 31. The wafer mounting base 32 brings an effect of substantially raising the central portion of wafer tray 31 by an amount equal to the height of wafer mounting base 32. A semiconductor wafer to be inspected is placed on an upper surface of wafer mounting base 32. The wafer mounting base 32 has a radial size substantially identical with that of the semiconductor wafer to be inspected.

The seal ring 33 is made of a rubber material. The wafer tray 31 has a circular groove formed in an outer peripheral region thereof. The seal ring 33, being coaxial with the wafer tray 31, is fitted into and firmly held in this groove of wafer tray 31. When the wafer tray unit is assembled with the probe card, the seal ring 33 provides an airtight sealing between them so as to define a vacuum chamber. The seal ring 33 holds a vacuum formed in the vacuum chamber. The vacuum valve 34 is attached to a cylindrical side surface of wafer tray 31 at one end and is connected to a vacuum pipe 35 radially extending in a body of the wafer tray 31. The other end of vacuum valve 34 is connected to a vacuum pump (not shown). The vacuum pipe 35 provides a passage connecting the vacuum valve 34 to an annular vacuum groove 36. The annular vacuum groove 36 is coaxial with the wafer tray 31. Thus, the vacuum valve 34, the vacuum pipe 35, and the vacuum groove 36 cooperate as pressure reducing means for decreasing the inside pressure of the vacuum chamber defined between the wafer tray unit and the probe card.

Figure 8:
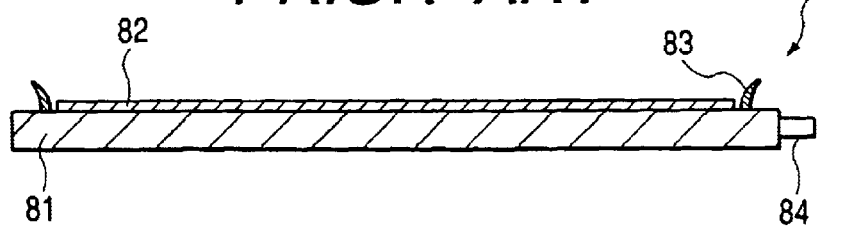
FIG. 8 is a cross-sectional view showing a conventional wafer tray unit.
Figure 9:
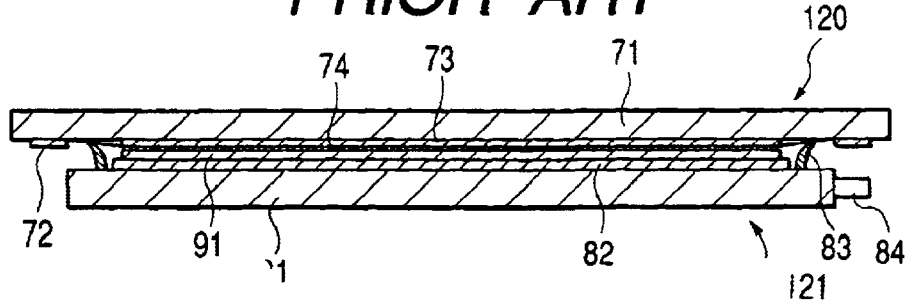
FIG. 9 is a cross-sectional view showing an assembled condition of the conventional probe card and the conventional wafer tray unit.
Figure 10A:
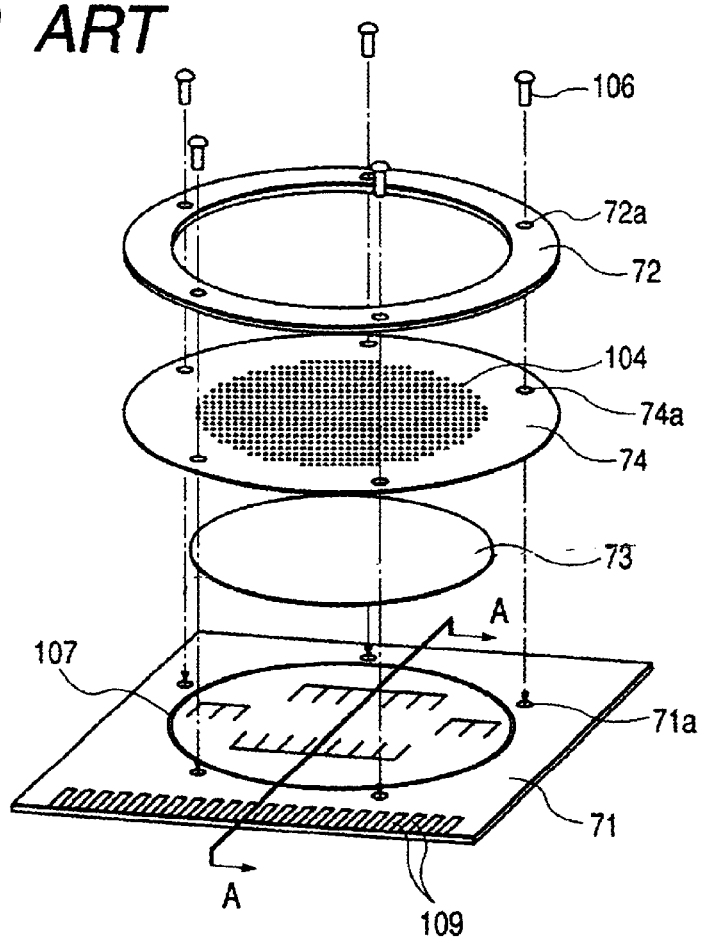
FIG. 10A is an exploded perspective view showing the conventional probe card.
Figure 10B:
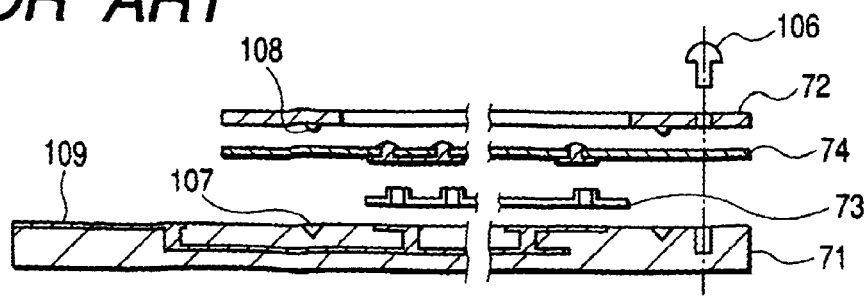
FIG. 10B is a cross-sectional view showing the conventional probe card taken along a line A—A shown in FIG. 10A.

The wafer tray unit of this embodiment is characterized in that the seal ring 33 is positioned far from the wafer mounting base 32 as apparent from the comparison with the conventional arrangement shown in FIG. 8. More specifically, the diameter of seal ring 33 is approximately 284 mm, whereas the diameter of conventional seal ring 83 (i.e., 8-inch wafer) is approximately 200 mm. Preferably, according to the illustration shown in FIGS. 2A and 2B, the radial gap between the seal ring 33 and the wafer mounting base 32 is in a range from $\frac{1}{20}$ to $\frac{1}{5}$ of the diameter of a semiconductor wafer. Thus, the wafer tray unit of this embodiment can provide a vacuum area sufficiently wider than the semiconductor wafer.

Figure 3:
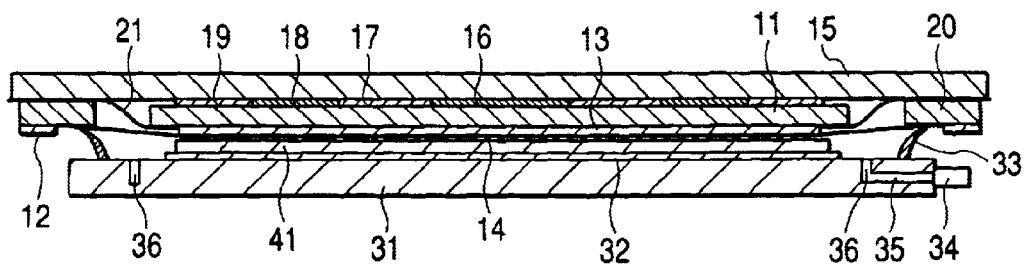
FIG. 3 is a cross-sectional view showing an assembled condition of the probe card and the wafer tray unit of the probe apparatus in accordance with the first embodiment of the present invention.

As shown in FIG. 3, the probe card is assembled with the wafer tray unit with a semiconductor wafer interposed therebetween. In FIG. 3, a semiconductor wafer 41 to be inspected is placed on an upper surface of wafer mounting base 32. The bump-formed membrane 14 is brought into contact with the semiconductor wafer 41 from above. The pressure substrate 15, the wafer tray 31, and the seal ring 33 cooperatively form an air-tightly closed space. The spacer 20 is positioned between the pressure substrate 15 and the wafer tray 31. The spacer 20 substantially reduces the clearance (i.e., a hollow space) between the pressure substrate 15 and the wafer tray 31. This is effective in that the length (altitudinal size) of seal ring 33 can be shortened. The seal ring 33 ensures an airtight sealing between the wafer tray 31 and the spacer 20.

The probe apparatus shown in FIG. 3 performs a burn-in screening in the following manner.

Figure 11A:
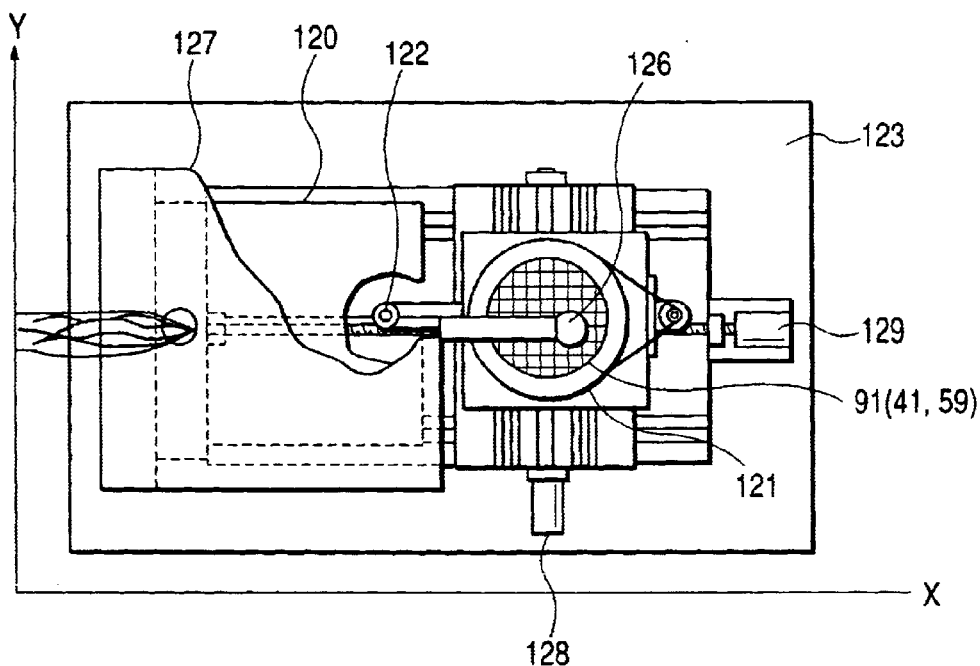
FIG. 11A is a plan view showing a conventional alignment apparatus.
Figure 11B:
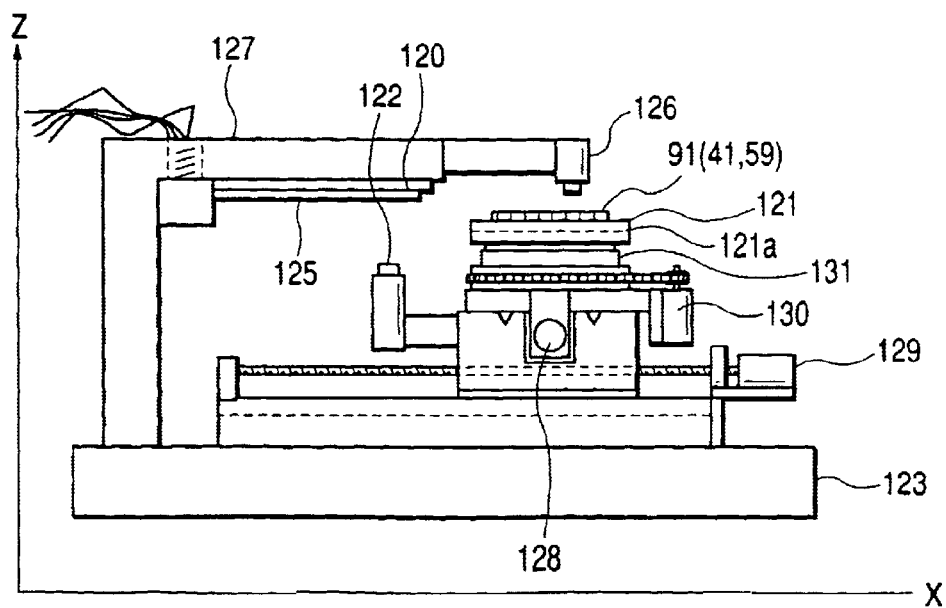
FIG. 11B is a side view showing the conventional alignment apparatus.

The alignment apparatus shown in FIGS. 11A and 11B is used to perform the burn-in screening of a semiconductor wafer.

The probe card is supported facedown by the by the probe card stage 127. The wafer tray unit is placed on a top table of the wafer stage 123. A slight altitudinal difference is provided between the semiconductor wafer 41 placed on the wafer mounting base 32 and the probe card supported facedown by the probe card stage 127. In this condition, the position of the bonding pads of semiconductor wafer 41 is recognized based on an image picked up by the wafer alignment camera 126. In other words, the position of the semiconductor wafer 41 on the X-Y plane is measured and identified. On the other hand, the position of the bumps 14a of bump-formed membrane 14 is recognized based on an image picked up by the probe card alignment camera 122.

Then, the X-axis control motor 129, the Y-axis control motor 128, and the θ control motor 130 are actuated to adust the position of semiconductor wafer 41 so as to meet the position of bump-formed membrane 14. Thus, the semiconductor wafer 41 shifts on the X-Y plane and stops at a predetermined position just below the bump-formed membrane 14.

Next, the Z-axis control mechanism 131 raises the wafer tray unit in the up-and-down direction. The semiconductor wafer 41 mounted on the wafer tray unit is thus raised in the up-and-down direction (i.e., in the Z-axis direction). The semiconductor wafer 41 contacts the bump-formed membrane 14 of the probe card which is supported facedown. The seal ring 33 contacts the spacer 20 and forms an airtightly closed space (i.e., a vacuum chamber) between the pressure substrate 15 and the wafer tray 31. In this assembled condition, the vacuum pump connected to the vacuum valve 34 is activated. The inside pressure of the closed space (i.e., the vacuum chamber) between the pressure substrate 15 and the wafer tray 31 is reduced. The pressure substrate 15 and the wafer tray 31 are strongly compressed by the atmospheric pressure applied on their outer surfaces. Thus, the semiconductor wafer 41 is surely brought into contact with the bump-formed membrane 14.

According to the probe apparatus of the first embodiment of the present invention, it is possible to provide a vacuum area sufficiently wider than the semiconductor wafer. Thus, a larger external force (=increased vacuum area× atmospheric pressure) is applied onto the pressure substrate 15 as well as onto the wafer tray 31. The first to fourth rubber members 16 to 19 receive the force applied to the pressure substrate 15.

Figure 4:
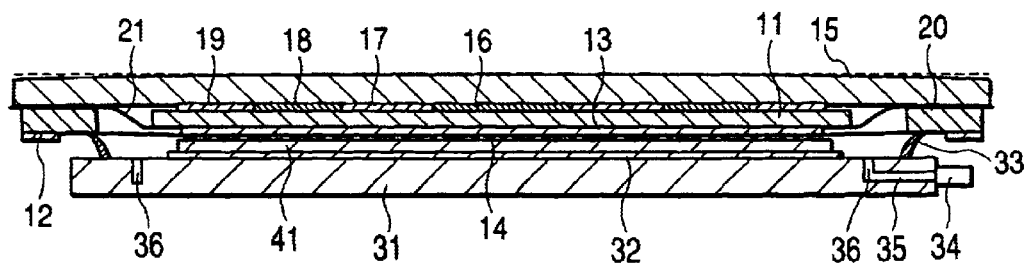
FIG. 4 is a cross-sectional view showing a pressed condition of the probe apparatus in accordance with the first embodiment of the present invention.

FIG. 4 shows a pressed condition of the probe apparatus. According to the arrangement of the first embodiment, the seal ring 33 is spaced relatively far in a radial direction from the semiconductor wafer 41. The pressure substrate 15 warpages (i.e., bends downward) at the radially outer region because there is no rigid support member located inside thereof. In other words, the warpage of pressure substrate 15 occurs at a portion corresponding to the gap between the seal ring 33 and the semiconductor wafer 41.

The first to fourth rubber members 16 to 19 have elasticities (softness) increasing in this order. Thus, the fourth rubber member 19 positioned at the radially outermost position causes the largest elastic deformation, while the first rubber member 16 positioned at the radially innermost position causes the smallest elastic deformation. The first to fourth rubber members 16 to 19 arranged in the order of elasticity substantially compensate the warpage (i.e., the downward bending) of the pressure substrate 15. As a result, a uniform load is applied everywhere on the wiring substrate 11.

According to the probe apparatus in accordance with the first embodiment of the present invention, the seal ring 33 has a diameter of approximately 284 mm which is larger than a diameter (approximately 200 mm) of the conventional seal ring (i.e., 8-inch wafer). The increased diameter of the seal ring 33 realizes an increased vacuum area (=633 cm$^2$) which is twice as large as the conventional vacuum area (-314 cm$^2$). Thus, the pressure substrate 15 receives a doubled external force. The doubled external force is then transmitted to the wiring substrate 11 via the first to fourth rubber members 16 to 19. Accordingly, a large load is uniformly applied everywhere on the wiring substrate 11. This means that a load of 13 gf per pin can be realized for a semiconductor wafer having 40,000 pins and more. The first embodiment of the present invention ensures electric connection between the bonding pads of semiconductor wafer 41 and the bumps of the probe card, thereby enabling a wafer level burn-in screening applied to a semiconductor wafer having 40,000 pins (in this case, bonding pads) or more. According to the first embodiment of the present invention, the average pin number can be increased up to a level of approximately 130 pins/cm$^2$.

As apparent from the foregoing description, the first embodiment of the present invention provides a probe card used for a burn-in screening or inspection applied to a semiconductor wafer. The probe card comprises main body substrate (i.e., pressure substrate) 15, elastic member 16–19 disposed on the main body substrate 15, wiring substrate 11 disposed on the elastic member 16–19, spacer 20 disposed on the main body substrate 15 and spaced radially outward from a periphery of the wiring substrate 11, numerous bumps 14a formed on membrane 14 disposed on the wiring substrate 11 with electric connection between the bumps and a wiring of the wiring substrate, and holding ring (i.e., ceramic ring) 12 disposed on the spacer 20 for tightly holding a periphery of the membrane 14.

Especially, the elastic member interposed or sandwiched between the main body substrate 15 and the wiring substrate 11 has higher elasticity at an outer peripheral region thereof compared with elasticity at a central region thereof. To this end, a plurality of rubber members 16 to 19 are coaxially arranged successively in the radial direction. The radially outermost rubber member has highest elasticity and the radially innermost rubber member has lowest elasticity.

Furthermore, the first embodiment of the present invention provides a wafer tray unit used for a burn-in screening or inspection applied to a semiconductor wafer. The wafer tray unit comprises wafer tray 31, wafer mounting base 32 provided on the wafer tray 31 for mounting semiconductor wafer 41, seal ring 33 disposed on the wafer tray 31 and spaced radially outward from a periphery of wafer mounting base 32, and passage 35 formed in the wafer tray 31 with one end of the passage 35 connected to vacuum valve 34 and the other end of the passage 35 opened into a gap between the seal ring 33 and the wafer mounting base 32.

Furthermore, the probe card and the wafer tray unit of the first embodiment of the present invention cooperatively constitute a probe apparatus used for a burn-in screening or inspection applied to a semiconductor wafer. According to the probe apparatus of the first embodiment, the semiconductor wafer 41 is placed on the wafer mounting base 32 of the wafer tray unit and is sandwiched from behind side by the probe card so as to provide electric connection between the bumps of the probe card and bonding pads of the semiconductor wafer 41. The seal ring 33 of the wafer tray unit is brought into contact with the probe card at a portion corresponding to the spacer 20 so as to provide an airtightly closed space between the probe card and the wafer tray unit, the airtightly closed space serving as a vacuum chamber accommodating the semiconductor wafer 41 and communicating with the vacuum valve 34 via the passage 35 formed in the wafer tray 31.

Second Embodiment

Figure 5:
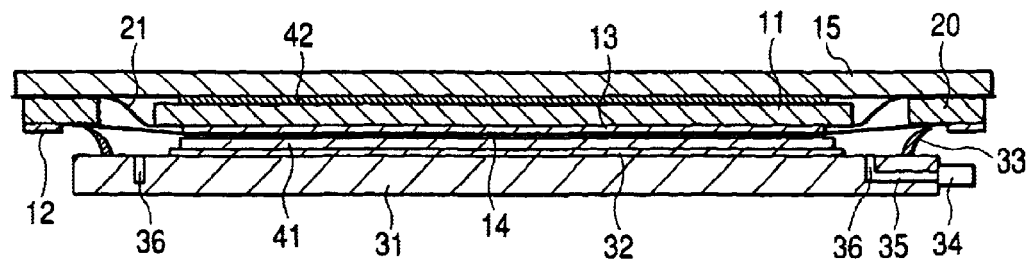
FIG. 5 is a cross-sectional view showing a probe apparatus in accordance with a second embodiment of the present invention.

FIG. 5 shows an assembled condition of a probe card and a wafer tray unit of a probe apparatus in accordance with a second embodiment of the present invention.

The probe apparatus of the second embodiment is structurally different from that of the first embodiment in that the first to fourth rubber members 16–19 are replaced by a single rubber member (i.e., fifth rubber member 42). The fifth rubber member 42 is interposed or sandwiched between the pressure substrate 15 and the wiring substrate 11. The fifth rubber member 42 has the same area as that of the wiring substrate 11. The fifth rubber member 42 has a radial size substantially identical with that of the wiring substrate 11. The fifth rubber member 42 has uniform elasticity. The fifth rubber member 42 has a sufficient thickness for absorbing warpage of the pressure substrate 15. The rest of the second embodiment is identical to that of the first embodiment.

The probe apparatus of the second embodiment of the present invention provides a vacuum area sufficiently wider than the semiconductor wafer. Thus, a larger external force (=increased vacuum area×atmospheric pressure) is applied to the pressure substrate 15. The pressure substrate 15 causes warpage occurring at the portion corresponding to the gap between the seal ring 33 and the semiconductor wafer 41. The external force applied on the pressure substrate 15 is elastically received by the fifth rubber member 42 which has uniform elasticity and has a sufficient thickness for absorbing warpage of the pressure substrate 15. The external force received by the fifth rubber member 42 is transmitted to the wiring substrate 11 via the fifth rubber member 42. As a result, a uniform load is applied everywhere on the wiring substrate 11.

Like the first embodiment, according to the probe apparatus of the second embodiment of the present invention, the seal ring 33 has a diameter of approximately 284 mm which is larger than a diameter (approximately 200 mm) of the conventional seal ring (i.e., 8-inch wafer). The increased diameter of the seal ring 33 realizes an increased vacuum area (=633 cm$^2$) which is twice as large as the conventional vacuum area (=314 cm$^2$). Thus, the pressure substrate 15 receives a doubled external force. The doubled external force is transmitted to the wiring substrate 11 via the fifth rubber member 42 having uniform rigidity. Accordingly, a large load is uniformly applied everywhere on the wiring substrate 11. The second embodiment of the present invention ensures electric connection between the bonding pads of semiconductor wafer 41 and the bumps of probe card, thereby enabling a wafer level burn-in screening applied to a semiconductor wafer having 40,000 pins (in this case, bonding pads) or more. According to the second embodiment of the present invention, the average pin number can be increased up to a level of approximately 130 pins/cm$^2$.

As apparent from the foregoing description, the second embodiment of the present invention provides the probe card including single rubber member 42 interposed or sandwiched between the main body substrate 15 and the wiring substrate 11. The single rubber member has a radial size substantially identical with that of the wiring substrate 11. The single rubber member 42 has uniform elasticity. The single rubber member 42 has a sufficient thickness for absorbing warpage of the main body substrate 15.

Third Embodiment

A probe apparatus in accordance with a third embodiment of the present invention is structurally identical with that of the second embodiment.

According to the probe apparatus of the third embodiment, a polyimide film is coated on a reverse surface (i.e., an outer surface in FIG. 5) of pressure substrate 15. Then, an appropriate treatment is applied to contract the polyimide film. As a result, a predetermined amount of warpage (i.e., an upward bending) is given to the pressure substrate 15. The warpage given to the pressure substrate 15 counteracts the downward bending of the pressure substrate 15 in the radially outer region corresponding to the gap between the seal ring 33 and the semiconductor wafer 41.

The rest of the third embodiment is identical to that of the second embodiment.

The probe apparatus of the third embodiment of the present invention provides a vacuum area sufficiently wider than the semiconductor wafer. Thus, a larger external force (=increased vacuum area×atmospheric pressure) is applied to the pressure substrate 15. When the external force is applied on the pressure substrate 15, the pressure substrate 15 bends downward at the radially outer region because there is no rigid support member located inside thereof. However, the downward bending of pressure substrate 15 is absorbed by the predetermined amount of upper warpage of pressure substrate 15 given beforehand. As a result, the pressure substrate 15 is free from warpage and returns a flat shape. The external force applied on the pressure substrate 15 is elastically received by the fifth rubber member 42 and is transmitted to the wiring substrate 11 via the fifth rubber member 42. Accordingly, a uniform load is applied everywhere on the wiring substrate 11.

Like the first embodiment, according to the probe apparatus of the third embodiment of the present invention, the seal ring 33 has a diameter of approximately 284 mm which is larger than a diameter (approximately 200 mm) of the conventional seal ring (i.e., 8-inch wafer). The increased diameter of the seal ring 33 realizes an increased vacuum area (=633 cm$^2$) which is twice as large as the conventional vacuum area (=314 cm$^2$). Thus, the pressure substrate 15 receives a doubled external force. The doubled external force is transmitted to the wiring substrate 11 via the fifth rubber member 42 having uniform rigidity. Accordingly, a large load is uniformly applied everywhere on the wiring substrate 11. The third embodiment of the present invention ensures electric connection between the bonding pads of semiconductor wafer 41 and the bumps of probe card, thereby enabling a wafer level burn-in screening applied to a semiconductor wafer having 40,000 pins (in this case, bonding pads) or more. According to the third embodiment of the present invention, the average pin number can be increased up to a level of approximately 130 pins/cm$^2$.

Fourth Embodiment

Figure 6:
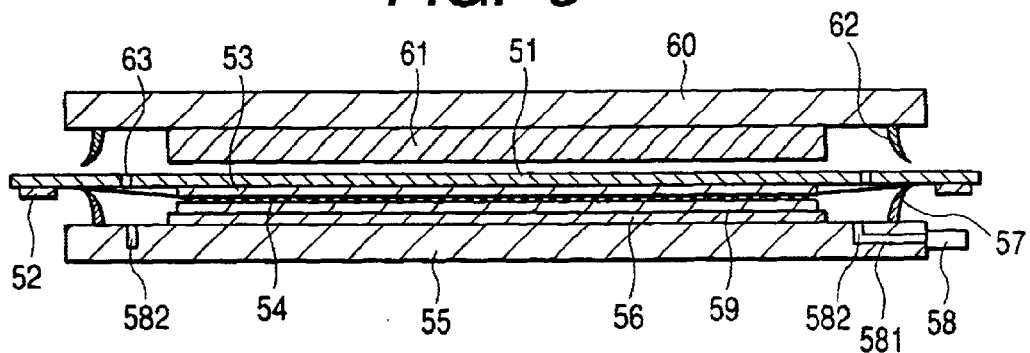
FIG. 6 is a cross-sectional view showing a probe apparatus in accordance with a fourth embodiment of the present invention.
Figure 7:
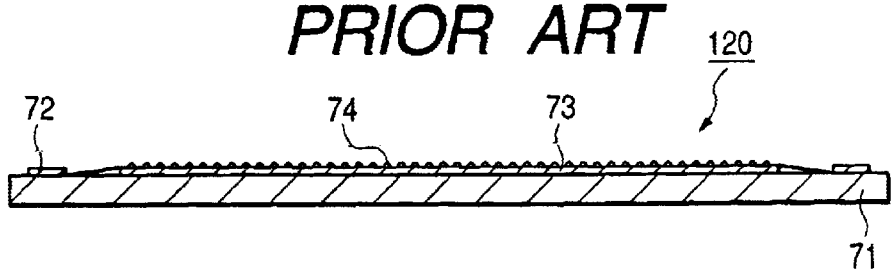
FIG. 7 is a cross-sectional view showing a conventional probe card.

FIG. 6 shows an assembled condition of a probe card and a wafer tray unit of a probe apparatus in accordance with a fourth embodiment of the present invention.

The probe card of the fourth embodiment of the present invention includes a wiring substrate 51, a ceramic ring 52, a PCR 53, and a bump-formed membrane 54. The wiring substrate 51 is made of a glass or a comparable material having a thermal expansion coefficient similar to that of a semiconductor wafer. The wiring substrate 51 has a surface brought into contact with the PCR 53. A signal, transmitted from the PCR 53 to the surface of wiring substrate 51, is output to the outside via a wiring arranged on this surface of wiring substrate 51. The PCR 53 is soft and thus has a function of absorbing the altitudinal dispersion of the bonding pads of semiconductor chip and the bumps of the probe card. Thus, PCR 73 ensures the transmission of signal from the bumps.

PCR 53 is interposed or sandwiched between the bump-formed membrane 54 and the wiring substrate 51. The bump-formed membrane 54 has a membrane tightly held by the ceramic ring 52. The bump-formed membrane 54 includes numerous bumps formed on the membrane, like the bumps 14a of bump-formed membrane 14 shown in FIG. 1A. Each bump provides electric connection to a corresponding bonding pad of a semiconductor wafer.

The wafer tray unit of the fourth embodiment includes a wafer tray 55, a wafer mounting base 56, a seal ring 57, and a vacuum valve 58. The wafer tray 55 is a circular plate member which has sufficient thickness or rigidity so as not to deform against the atmospheric pressure. The wafer mounting base 56, being a circular member coaxial with the wafer tray 55, is placed on an upper surface of wafer tray 55. The wafer mounting base 56 brings an effect of substantially raising the central portion of wafer tray 55 by an amount equal to the height of wafer mounting base 56. A semiconductor wafer 59 to be inspected is placed on an upper surface of wafer mounting base 56. The seal ring 57 is made of a rubber material. The wafer tray 55 has a circular groove formed in an outer peripheral region thereof. The seal ring 33, being coaxial with the wafer tray 55, is fitted into and firmly held in this groove of wafer tray 55. When the wafer tray unit is assembled with the probe card, the seal ring 57 provides an airtight sealing between them so as to define a vacuum chamber. The seal ring 57 holds a vacuum formed in the vacuum chamber. The vacuum valve 58 is attached to a cylindrical side surface of wafer tray 55 at one end and is connected to a vacuum pipe 581 radially extending in a body of the wafer tray 55. The other end of vacuum valve 58 is connected to a vacuum pump (not shown). The vacuum pipe 581 provides a passage connecting the vacuum valve 58 to an annular vacuum groove 582. The annular vacuum groove 582 is coaxial with the wafer tray 55. Thus, the vacuum valve 58, the vacuum pipe 581, and the vacuum groove 582 cooperate as pressure reducing means for decreasing the inside pressure of the vacuum chamber defined between the wafer tray unit and the probe card.

The wafer tray unit of this embodiment is characterized in that the seal ring 57 is positioned far from the wafer mounting base 56 as apparent from the comparison with the conventional arrangement shown in FIG. 8. More specifically, a diameter of the seal ring 57 is approximately 284 mm, whereas a diameter of the conventional seal ring 83 (i.e., 8-inch wafer) is approximately 200 mm. In other words, the wafer tray unit of this embodiment can provide a vacuum area sufficiently wider than the semiconductor wafer, in the same manner as the above-described first to third embodiments.

The probe card is placed facedown on the wafer tray unit. The bump-formed membrane 54 is brought into contact with the semiconductor wafer 59 placed on the upper surface of wafer mounting base 56.

The probe apparatus of the fourth embodiment further includes a reversed tray unit. The reversed tray unit includes a reversed tray 60, a reversed mounting base 61, and a reversed seal ring 62. The reversed tray unit and the wafer tray unit are symmetrically arranged with respect to the wiring substrate 51. The size of reversed tray 60 is substantially the same as that of the wafer tray 55. The reversed mounting base 61 is disposed on the reversed tray 60. The size of reversed mounting base 61 is substantially the same as the size of semiconductor wafer 59. The reversed seal ring 62 is made of a rubber member. The reversed tray 60 has a circular groove formed in an outer peripheral region thereof. The seal ring 62, being coaxial with the reversed tray 60, is fitted into and firmly held in this groove of reverse tray 60. The size of reversed seal ring 62 is substantially the same as that of seal ring 57. The position of reversed seal ring 62 with respect to the wiring substrate 51 is substantially the same as that of seal ring 57. The reversed seal ring 62 and the seal ring 57 face each other. The wiring substrate 51 intervenes between them. When the reversed tray unit is assembled with the wiring substrate 51, the reversed seal ring 62 provides an airtight sealing therebetween.

The upper vacuum chamber is positioned between the reversed tray 60 and the wiring substrate 51. The lower vacuum chamber is positioned between the wafer tray 55 and the wiring substrate 51. The wiring substrate 51 has through holes 63. The upper and lower vacuum chambers communicate each other via the through holes 63. In other words, the seal rings 57 and 62 define an airtightly closed space formed between the wafer tray 55 and the reversed tray 60. The wiring substrate 51 separates this closed space into the upper and lower vacuum chambers via the through holes 63. Although not shown in the drawing, the bump-formed membrane 54 has communication holes for providing the air passage between the upper and lower vacuum chambers.

The probe apparatus shown in FIG. 6 performs a burn-in screening in the following manner.

The alignment apparatus shown in FIGS. 1A and 11B is used to perform the burn-in screening of a semiconductor wafer.

First, the probe card is assembled with the reversed tray unit beforehand. The assembly of the probe card and the reversed tray unit is supported facedown by the probe card stage 127. The wafer tray unit is placed on a top table of the wafer stage 123. A slight altitudinal difference is provided between the semiconductor wafer 59 placed on the wafer mounting base 56 and the probe card supported facedown by the probe card stage 127. In this condition, the position of the bonding pads of semiconductor wafer 59 is recognized based on an image picked up by the wafer alignment camera 126. In other words, the position of the semiconductor wafer 59 on the X-Y plane is measured and identified. On the other hand, the position of the bumps of bump-formed membrane 54 is recognized based on an image picked up by the probe card alignment camera 122.

Then, the X-axis control motor 129, the Y-axis control motor 128, and the θ control motor 130 are actuated to adust the position of semiconductor wafer 59 so as to meet the position of bump-formed membrane 54. Thus, the semiconductor wafer 59 shifts on the X-Y plane and stops at a predetermined position just below the bump-formed membrane 54.

Next, the Z-axis control mechanism 131 raises the wafer tray unit in the up-and-down direction. The semiconductor wafer 59 mounted on the wafer tray unit is thus raised in the up-and-down direction (i.e., in the Z-axis direction). The semiconductor wafer 59 contacts the bump-formed membrane 54 of the probe card which is supported facedown. The seal ring 57 contacts the lower surface of wiring substrate 51 via the bump-formed membrane 54, and forms an airtightly closed space (i.e., lower vacuum chamber) between the wafer tray 31 and the wiring substrate 51. In this assembled condition, the vacuum pump connected to the vacuum valve 58 is activated. The inside pressure of the lower vacuum chamber defined between the wafer tray 31 and the wiring substrate 51 is reduced. The upper vacuum chamber defined between the reversed tray 60 and the wiring substrate 51 communicates with the lower vacuum chamber defined between the wafer tray 31 and the wiring substrate 51. Accordingly, the inside pressure of the upper vacuum chamber is also reduced by the vacuum pump.

Through this suction or vacuumizing operation, the wafer tray 55 is strongly pressed toward the wiring substrate 51 by the atmospheric pressure applied on the outer surface of the wafer tray 55. The semiconductor wafer 59 is surely brought into contact with the bump-formed membrane 54.

The probe apparatus of the fourth embodiment of the present invention provides a vacuum area sufficiently wider than the semiconductor wafer 59. Thus, a larger external force (=increased vacuum area x atmospheric pressure) is applied to the wafer tray 55. The large external force is transmitted to the wiring substrate 51 via the semiconductor wafer 59. A large load is applied to the wiring substrate 11 to ensure electric connection between the bonding pads of semiconductor wafer 59 and the bumps of probe card.

Meanwhile, the reversed tray 60 is strongly pressed toward the wiring substrate 51 by the atmospheric pressure applied on the outer surface of the reversed tray 60. The reverse tray 60 receives a large external force which is identical with the force applied to the wafer tray 55. This external force is transmitted to the reverse surface of wiring substrate 51 via the reversed mounting base 61. As a result, the same pressure is applied onto the front and reverse surfaces of wiring substrate 51. A uniform load is applied everywhere on the wiring substrate 51 without causing warpage.

Like the first embodiment, according to the probe apparatus of the fourth embodiment of the present invention, the seal ring 57 has a diameter of approximately 284 mm which is larger than a diameter (approximately 200 mm) of the conventional seal ring (i.e., 8-inch wafer). The increased diameter of the seal ring 57 realizes an increased vacuum area (=633 cm$^2$) which is twice as large as the conventional vacuum area (=314 cm$^2$). Thus, the wafer tray 55 and the reversed tray 60 receive a doubled external force. The doubled external force is transmitted to the wiring substrate 51 from both, front and reverse, surfaces thereof. Accordingly, a large load is uniformly applied everywhere on the wiring substrate 51. The fourth embodiment of the present invention ensures electric connection between the bonding pads of semiconductor wafer 59 and the bumps of probe card, thereby enabling a wafer level burn-in screening applied to a semiconductor wafer having 40,000 pins (in this case, bonding pads) or more. According to the fourth embodiment of the present invention, the average pin number can be increased up to a level of approximately 130 pins/cm$^2$.

As described above, the present invention provides a probe apparatus utilizing a wider vacuum area to apply a large pressure on a semiconductor wafer. Furthermore, the present invention provides a probe apparatus which is capable of applying a uniform pressure on the semiconductor wafer. Thus, the present invention can increase the connecting pin number per unit area of a semiconductor wafer. The present invention realizes a wafer level burn-in screening applied to an advanced semiconductor wafer having an increased number of numerous pins or chips formed thereon.

As apparent from the foregoing description, the fourth embodiment of the present invention provides a probe apparatus used for a burn-in screening or inspection applied to a semiconductor wafer. The probe apparatus of the fourth embodiment comprises the probe card, the wafer tray unit, and the reversed tray unit. The probe card comprises wiring substrate 51 having at least one through hole 63, numerous bumps formed on membrane 54 disposed on the wiring substrate 51 with electric connection between the bumps and a wiring of the wiring substrate 51, holding ring (i.e., ceramic ring) 52 disposed on the wiring substrate 51 for tightly holding a periphery of the membrane 54. The wafer tray unit comprises wafer tray 55, wafer mounting base 56 provided on the wafer tray 55 for mounting semiconductor wafer 59, seal ring 57 disposed on the wafer tray 55 and spaced radially outward from a periphery of the wafer mounting base 56, and passage 581 formed in the wafer tray 55 with one end of the passage 581 connected to vacuum valve 58 and the other end of the passage 581 opened into a gap between the seal ring 57 and the wafer mounting base 56. The reversed tray unit comprises reversed tray 60, reversed mounting base 61 provided on the reversed tray 60, and reversed seal ring 62 disposed on the reverse tray 60. According to the probe apparatus of the fourth embodiment, the semiconductor wafer 59 is placed on the wafer mounting base 56 of the wafer tray unit and is sandwiched from behind side by the probe card so as to provide electric connection between the bumps of the probe card and bonding pads of the semiconductor wafer 59. The seal ring 57 of the wafer tray unit is brought into contact with the probe card so as to provide an airtightly closed space between the probe card and the wafer tray unit, the airtightly closed space serving as a first vacuum chamber accommodating the semiconductor wafer 59 and communicating with the vacuum valve 58 via the passage 581 formed in the wafer tray 55. And, the reversed seal ring 62 of the reversed tray unit is brought into contact with a behind side of the probe card to provide an airtightly closed space between the probe card and the reversed tray unit which serves as a second vacuum chamber, the second vacuum chamber communicating with the first vacuum chamber via the through hole 63 of the wiring substrate 51.

What is claimed is:

1. A probe card used for a burn-in screening or inspection applied to a semiconductor wafer, said probe card comprising:

a main body substrate;

an elastic member disposed on said main body substrate;

a wiring substrate disposed on said elastic member;

a spacer disposed on said main body substrate and spaced radially outward from a periphery of said wiring substrate;

a plurality of bumps formed on a membrane disposed on said wiring substrate with electric connection between said bumps and a wiring of said wiring substrate; and a holding ring disposed on said spacer for tightly holding a periphery of said membrane.

2. The probe card in accordance with claim 1, wherein said elastic member has higher elasticity at an outer peripheral region thereof compared with elasticity at a central region thereof.

3. The probe card in accordance with claim 2, wherein said elastic member consists of a plurality of rubber members which are coaxial with each other and are arranged successively in a radial direction.

4. The probe card in accordance with claim 3, wherein a radially outermost rubber member has highest elasticity.

5. The probe card in accordance with claim 3, wherein said plurality of rubber members have successively increasing elasticities in such a manner that a radially outermost rubber member has highest elasticity and a radially innermost rubber member has lowest elasticity.

6. The probe card in accordance with claim 1, wherein said main body substrate is made of a glass or a comparable material.

7. The probe card in accordance with claim 1, wherein said main body substrate has a radial size larger than that of said wiring substrate.

8. The probe card in accordance with claim 1, wherein said holding ring has a radial size substantially identical to or slightly smaller than that of said main body substrate.

9. The probe card in accordance with claim 1, wherein said wiring substrate is entirely involved within an area defined by an inner rim of said holding ring.

10. The probe card in accordance with claim 1, wherein a radial gap between said holding ring and said wiring substrate is in a range from 1/20 to 1/5 of a diameter of the semiconductor wafer.

11. The probe card in accordance with claim 1, wherein said spacer has a radial size substantially identical to or slightly smaller than that of said main body substrate and is larger than that of said wiring substrate.

12. The probe card in accordance with claim 1, wherein a predetermined amount of warpage is given to said main body substrate beforehand to cancel a bending of said main body substrate when subjected to an external force.

13. The probe card in accordance with claim 12, wherein a polyimide film is coated on a reverse surface of said main body substrate so as to counteract said bending of said main body substrate.

14. A wafer tray unit used for a burn-in screening or inspection applied to a semiconductor wafer, said wafer tray unit comprising:
   a wafer tray;
   a wafer mounting base provided on said wafer tray for mounting a semiconductor wafer;
   a seal ring disposed on said wafer tray, and spaced radially outward from a periphery of said wafer mounting base; and
   a passage formed in said wafer tray, with one end of said passage connected to a vacuum valve and the other end of said passage opened into a gap between said seal ring and said wafer mounting base, wherein a radial gap between said seal ring and said wafer mounting base is in a range from 1/20 to 1/5 of a diameter of said semiconductor wafer.

15. A probe apparatus used for a burn-in screening or inspection applied to a semiconductor wafer, said probe apparatus comprising a probe card and a wafer tray unit, said probe card comprising:
   a main body substrate;
   an elastic member disposed on said main body substrate;
   a wiring substrate disposed on said elastic member;
   a spacer disposed on said main body substrate and spaced radially outward from a periphery of said wiring substrate;
   a plurality of bumps formed on a membrane disposed on said wiring substrate with electric connection between said bumps and a wiring of said wiring substrate; and
   a holding ring disposed on said spacer for tightly holding a periphery of said membrane,
said wafer tray unit comprising:
   a wafer tray;
   a wafer mounting base provided on said wafer tray for mounting a semiconductor wafer;
   a seal ring disposed on said wafer tray and spaced radially outward from a periphery of said wafer mounting base; and
   a passage formed in said wafer tray, with one end of said passage connected to a vacuum valve and the other end of said passage opened into a gap between said seal ring and said wafer mounting base,
wherein the semiconductor wafer is placed on said wafer mounting base of said wafer tray unit and is sandwiched from behind side by said probe card so as to provide electric connection between said bumps of said probe card and bonding pads of said semiconductor wafer, and
said seal ring of said wafer tray unit is brought into contact with said probe card at a portion corresponding to said spacer so as to provide an airtightly closed space between the probe card and said wafer tray unit, said airtightly closed space serving as a vacuum chamber accommodating said semiconductor wafer and communicating with said vacuum valve via said passage formed in said wafer tray.

* * * * *